United States Patent
Kamm et al.

(10) Patent No.: US 7,060,399 B2
(45) Date of Patent: Jun. 13, 2006

(54) REFLECTIVE MIRROR FOR LITHOGRAPHIC EXPOSURE AND PRODUCTION METHOD

(75) Inventors: Frank-Michael Kamm, Unterhaching (DE); Jenspeter Rau, München (DE)

(73) Assignee: Infineon Technologies AG, Munich (DE)

( * ) Notice: Subject to any disclaimer, the term of this patent is extended or adjusted under 35 U.S.C. 154(b) by 166 days.

(21) Appl. No.: 10/632,752

(22) Filed: Aug. 1, 2003

(65) Prior Publication Data

(30) Foreign Application Priority Data

Aug. 1, 2002 (DE) ................. 102 35 255

(51) Int. Cl.
    *G01F 9/00* (2006.01)
(52) U.S. Cl. .......................................... 430/5
(58) Field of Classification Search ............. 430/5, 430/322; 438/785, 756; 427/553–555
    See application file for complete search history.

(56) References Cited

U.S. PATENT DOCUMENTS

| 6,673,524 | B1 * | 1/2004 | Ghandehari et al. | ....... 430/322 |
| 2005/0048800 | A1 * | 3/2005 | Wagener | .............. 438/785 |

FOREIGN PATENT DOCUMENTS

EP    1 065 532 A2    1/2001

OTHER PUBLICATIONS

Morita, M. et al.: "Native Oxide Growth on Silicon Surface in Wet Ambient", Extended Abstract of the 22$^{nd}$ Conference on Solid State Devices and Materials, 1990, pp. 1063-1066.
Yasaka, T. et al.: "Layer-By-Layer Oxidation of Silicon", Materials Research Society Proc., vol. 222, 1991, pp. 225-230.
Morita, M. et al.: "Control Factor of Native Oxide Growth on Silicon Surface in Air or in Ultrapure Water", Appl. Phys. Lett. 55 (6), American Institute of Physics, Aug. 7, 1989, pp. 562-564.

* cited by examiner

*Primary Examiner*—S. Rosasco
(74) *Attorney, Agent, or Firm*—Laurence A. Greenberg; Werner H. Stemer; Ralph E. Locher

(57) ABSTRACT

A reflective optical mirror for semiconductor fabrication includes a capping layer above a reflective multilayer sequence. A doping is provided for the capping layer and an artificial oxide layer is grown on the capping layer with the aid of hydrogen peroxide, in particular in the presence of a catalyst. The artificially grown oxide layer is more homogeneous than a naturally grown oxide and thereby improves optical properties of the mirror during a lithographic exposure of semiconductor products.

8 Claims, 3 Drawing Sheets

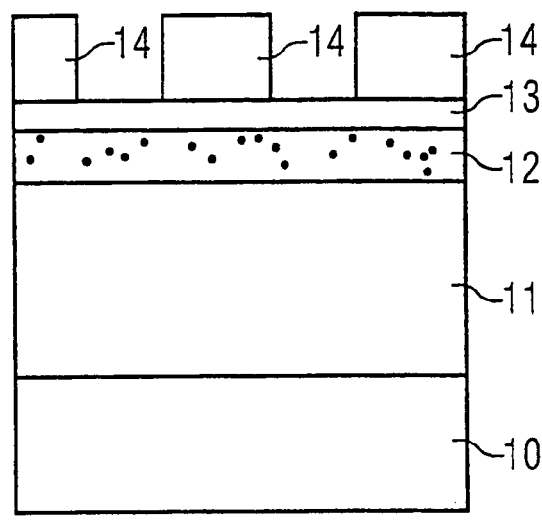
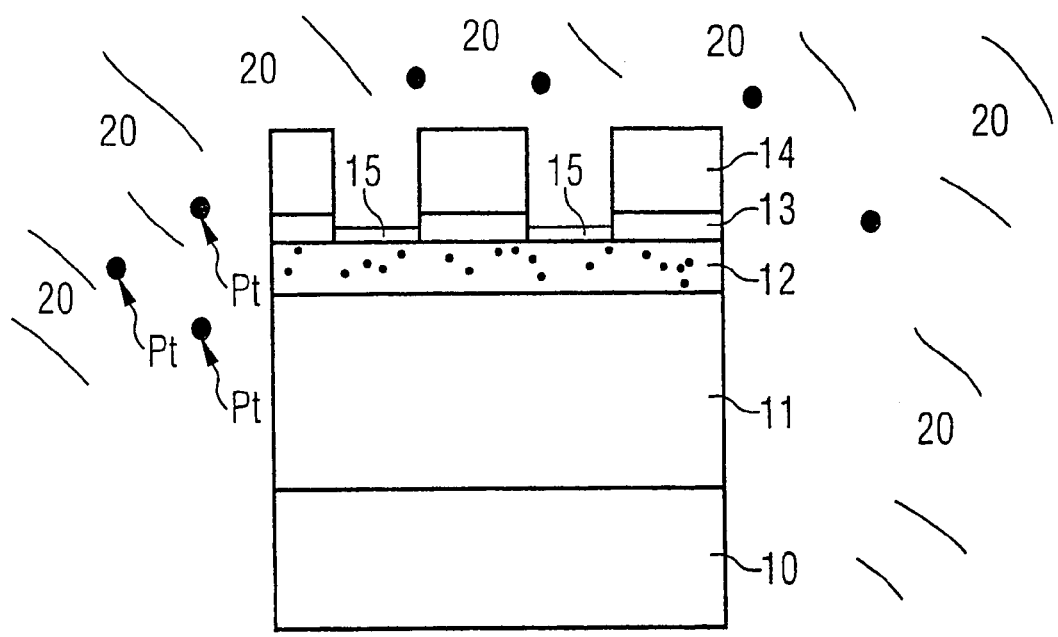

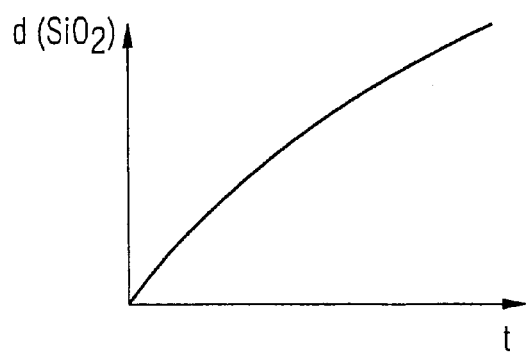
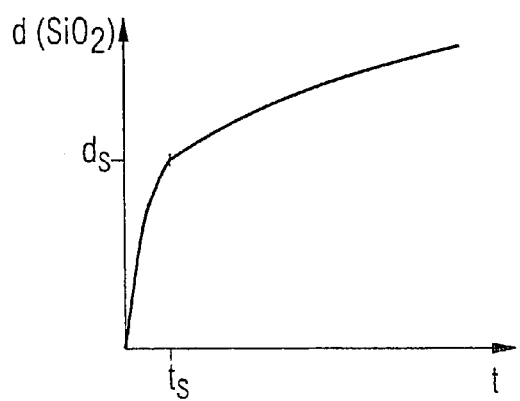
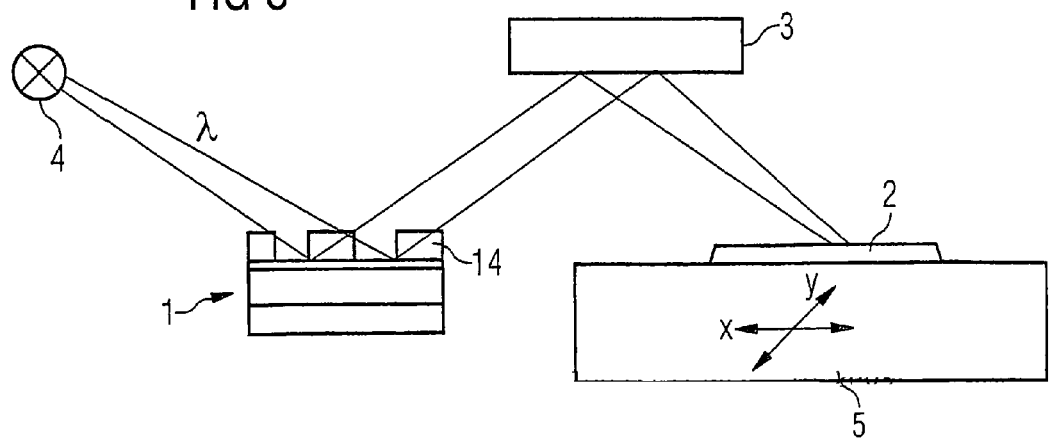

REFLECTIVE MIRROR FOR LITHOGRAPHIC EXPOSURE AND PRODUCTION METHOD

BACKGROUND OF THE INVENTION

Field of the Invention

The invention relates to a method for producing a reflective mirror for the lithographic exposure of semiconductor products, which includes the formation of a multilayer structure on a substrate and a capping layer above the multilayer structure. The capping layer is made of a material on which a natural oxide layer forms in air. The invention also relates to a reflective optical mirror for the lithographic exposure of semiconductor products, having a substrate, a multilayer structure which reflects electromagnetic radiation through constructive interference, and a capping layer above the multilayer structure. The capping layer is formed of a material on which a natural oxide layer forms in air.

In semiconductor fabrication, the surfaces of semiconductor substrates or of layers disposed thereon are patterned lithographically by a photosensitive resist layer being deposited on them and exposed lithographically. During that lithographic exposure, a two-dimensional mask structure is imaged onto the resist layer. The carrier of the mask structure is a so-called reticle, which is also referred to herein as a mask. On the reticle, the structure to be exposed is realized in the form of an already patterned layer on an imaging scale magnified approximately 4 to 10 times. The pattern of that patterned layer is produced on the semiconductor substrate after having been reduced in size to the resist mask through the use of an imaging optical configuration. The exposed resist layer is developed and serves as a mask for an etching, an implantation or another treatment of the semiconductor substrate or of the layer to be patterned that is situated thereon.

Either transmission masks, having structures which are realized in a chromium layer, or reflection masks, are used as a mask (reticle) for the lithographic exposure of semiconductor products. Those reflection masks represent optical mirrors having surfaces which are covered with a patterning absorption layer. Reflection masks are used in particular for wavelengths in the extreme UV region, i.e. between 1 and 100 nm, since most materials absorb in that wavelength range. The reflection of the EUV (extreme ultraviolet) wavelength is achieved with the aid of multilayer structures composed of a multiplicity of thin layers or layer pairs at interfaces of which a fraction of the incident radiation is reflected in each case. Constructive interference of the radiation reflected at various interfaces produces a reflected beam which, in optically demagnified fashion, can be directed onto a semiconductor product. The mask structure disposed above the multilayer structure is imaged onto the resist layer of the semiconductor product.

A reflection mask of that type thus represents a reflective optical mirror. Above the multilayer structure, the mirror has a capping layer, which serves as a protective layer for the multilayer structure. The multilayer structure often includes an alternate sequence of molybdenum layers and silicon layers. A silicon layer is then usually used as the capping layer. The silicon layer is disposed above the topmost molybdenum layer and has a larger layer thickness than the silicon layers of the multilayer structure. Typically, the layers of the multilayer structure have layer thicknesses of about 7 nm and the capping layer has a layer thickness of 10 to 20 nm. However, depending on the wavelength used, the layer thickness may deviate greatly from those particulars in order to effect a constructive interference of the reflected radiation at the relevant wavelength. A buffer layer is usually disposed above the capping layer and a patterned mask layer containing the structure is disposed on the buffer layer. The buffer layer is initially present over the whole area of the capping layer as provisional protection thereof and is required in particular in the case of repairs to the mask structure of the patterned mask layer. Before the reflective optical mirror is used, the buffer layer is removed at the locations that are not covered by the patterned mask layer, so that the capping layer is uncovered there.

A natural oxide having a thickness of a few nanometers forms on a silicon surface of the capping layer that is exposed to air. That natural oxide growth arises spontaneously over the course of a few days to a few weeks and also continues over a relatively long time. Therefore, reflective optical mirrors occasionally have to be etched if they are used over a relatively long time, in order to remove the oxide layer that has formed. The oxide layer thickness to be removed must be determined precisely and the removal must be controlled precisely. However, methods for doing so are not known.

The natural oxide growth on silicon surfaces in ambient air is subject to statistical fluctuations. The thickness of the oxide layer varies on different regions of a silicon surface. Therefore, the reflectivity, more precisely the reflection coefficient which represents the proportion of reflected radiation in relation to the incident radiation, is not homogeneous over the silicon surface.

The problem of inhomogeneous layer thicknesses of natural oxides could theoretically be combated through controlled etching-back of the oxide layers that are formed. However, etching processes are also subject to statistical fluctuations, as a result of which the etching rate on the silicon oxide surface may have a varying magnitude locally.

Experiments are known in which the oxide growth was observed in water, in some instances also in hydrogen peroxide for different dopings. It is known, inter alia, to accelerate the oxide growth in hydrogen peroxide with the aid of platinum. Such experiments were carried out in order to investigate the time dependence of the oxide growth under different conditions.

SUMMARY OF THE INVENTION

It is accordingly an object of the invention to provide a reflective mirror for lithographic exposure and a production method, which overcome the hereinafore-mentioned disadvantages of the heretofore-known methods and devices of this general type and in which the reflective optical mirror has a reflectivity that is as homogeneous as possible over the mirror surface.

With the foregoing and other objects in view, there is provided, in accordance with the invention, a method for producing a reflective mirror for the lithographic exposure of semiconductor products. The method comprises forming a multilayer structure on a substrate, and producing a capping layer above the multilayer structure from a doped material on which a natural oxide layer forms in air. The capping layer is brought into contact with hydrogen peroxide resulting in an artificially grown oxide layer forming on the capping layer.

According to the invention, an oxide layer is produced artificially. The oxide layer covers the capping layer and therefore impairs the transparency of the mirror by a certain amount. Oxide layers are conventionally avoided for this reason. According to the invention, however, this oxide layer is produced by an accelerated growth process which results in the growth taking place homogeneously over the surface of the capping layer. The oxide layer thus formed has a homogeneity which is not achieved in the course of natural oxide growth, as a result of which better optical properties of the mirror are obtained overall. The disadvantage of the reduced transparency is compensated for over the course of time by the natural oxide growth which commences anyway. What is advantageous about the oxide layer formed according to the invention is that the further natural growth on the artificially grown oxide layer takes place at a comparatively low growth rate, which means that inhomogeneities which possibly arise are formed much more weakly. According to the invention, unlike conventional practice, the capping layer is not produced from undoped material, but rather from a doped material. The latter is brought into contact with hydrogen peroxide, according to the invention, in order to grow a homogeneous oxide layer artificially. In particular, it is provided that a catalyst, for example platinum, is added to the hydrogen peroxide, so that the artificially grown oxide layer is formed in the presence of the catalyst (platinum).

In accordance with another mode of the invention, the capping layer is dipped into hydrogen peroxide having a concentration of between 10% and 50% for a time duration of between 3 and 120 minutes. It is precisely in the presence of platinum or another catalyst that an artificial oxide layer can grow within a short time, with that layer only arising over the course of weeks or months under natural conditions.

In accordance with a further mode of the invention, the hydrogen peroxide is heated before and/or during the immersion of the capping layer. This makes it possible to achieve a further acceleration of the artificial oxide growth.

In accordance with an added mode of the invention, the capping layer produced through the contact with hydrogen peroxide has a layer thickness of between 0.8 and 2.0 nm. Even in the case of a subsequent natural oxide growth on this artificially produced oxide layer, it is ensured that a homogeneous layer is formed on the first 0.8 to 2.0 nm above the capping layer surface, where the oxide grows the fastest.

In accordance with an additional mode of the invention, the concentration of the doping is chosen with a magnitude such that the natural oxide growth on the oxide layer grown through contact with hydrogen peroxide is annually less than 10% of the layer thickness grown with the aid of hydrogen peroxide.

In accordance with yet another mode of the invention, the capping layer is produced from an n-doped material. Although p-type dopings are also appropriate, in principle, for doping the capping layer, in order to achieve an accelerated oxide growth, it has been observed that the growth process is slowed down significantly precisely on n-doped capping layer material, in particular silicon.

In accordance with yet a further mode of the invention, in order to provide a sufficiently high and homogeneous doping over the entire surface of the reflective optical mirror, the capping layer is preferably applied to the multilayer structure by a deposition, for example by a chemical vapor deposition (CVD) or by a physical deposition (PVD or physical vapor deposition), for instance by sputtering. The negative doping is preferably introduced into the capping layer during this deposition by supplying the dopant together with the basic material of the capping layer to the surface of the reflective mirror. This in-situ doping has the advantage that there is no need for any subsequent process steps for doping the capping layer. As an alternative, however, the doping may subsequently be introduced into the capping layer through the use of an implantation with a low implantation energy. It is equally conceivable for the initially undoped capping layer to be brought into contact with a dopant-containing medium, for instance a liquid or another fluid, so that the dopant can diffuse into the capping layer. During this treatment, the deeper layers of the multilayer structure are protected from attack by the dopant.

In accordance with yet an added mode of the invention, the capping layer is preferably produced from n-doped silicon. The growth of an amorphous silicon layer is preferred in this case.

With the objects of the invention in view, there is also provided a reflective optical mirror for the lithographic exposure of semiconductor products. The mirror comprises a substrate, a multilayer structure disposed above the substrate for reflecting electromagnetic radiation through constructive interference, and a capping layer disposed above the multilayer structure. The capping layer is formed of a material on which a natural oxide layer forms in air. The material of the capping layer is doped and the oxide layer includes a region having a layer thickness with the same doping as the doping of the capping layer being incorporated into an oxide of the oxide layer.

The reflective optical mirror of the invention, for the lithographic exposure of semiconductor products, has an oxide layer or a region of an oxide layer which corresponds to a minimum layer thickness and in which the same doping as the doping of the capping layer is incorporated into the oxide of the oxide layer. On the finished mirror too, the identical doping indicates an oxide layer formed contemporaneously with the production of the capping layer. Dopings or impurities which arise due to changing ambient conditions and are of the kind that arise during natural oxide growth cannot occur in the artificially produced oxide. The oxide layer thus produced has a homogeneous layer thickness and thus improves the optical properties of the mirror.

In accordance with another feature of the invention, the reflective mirror preferably has an oxide layer which has a layer thickness of between 0.8 and 2.0 nm. The capping layer is preferably composed of n-doped silicon and phosphorus or arsenic is preferably provided as the doping. However, according to the invention, further customary n-conducting dopants can also be introduced into the capping layer of the reflective mirror for the purpose of ending the natural oxide growth. The silicon-containing capping layer is preferably amorphous.

In accordance with a further feature of the invention, in accordance with the intended purpose for the lithographic exposure of semiconductor products, the reflective mirror preferably has a patterned mask layer, having a structure that can be transferred to one or more semiconductor products. A buffer layer may be situated between the patterned mask layer and the capping layer, but is removed on the regions of the capping layer which are not covered by the mask layer. The natural oxide forms at these uncovered locations.

In accordance with a concomitant feature of the invention, the multilayer structure of the reflective mirror is preferably dimensioned in such a way that electromagnetic radiation having a wavelength which is greater than 1 nm and less than 100 nm is reflected. In particular, extremely short wavelengths of between 1 and 20 nm, for example 13 nm, which are far removed from the spectrum of conventionally used wavelengths in the UV region, can be used with the aid of the reflective mirror according to the invention with a high luminous efficiency for the lithographic patterning.

Other features which are considered as characteristic for the invention are set forth in the appended claims.

Although the invention is illustrated and described herein as embodied in a reflective mirror for lithographic exposure and a production method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1 to 5 are diagrammatic, cross-sectional views of a reflective optical mirror in different stages of a method according to the invention;

FIG. 6 is a graph showing a temporal profile of a natural oxide growth on a conventional reflective mirror;

FIG. 7 is a graph showing a temporal profile of a natural oxide growth in a reflective mirror according to the invention; and FIG. 8 is a cross-sectional view of a simplified diagrammatic construction during a lithographic patterning of a semiconductor product with the aid of a reflective mirror.

DESCRIPTION OF THE PREFERRED EMBODIMENTS

Figure 1:
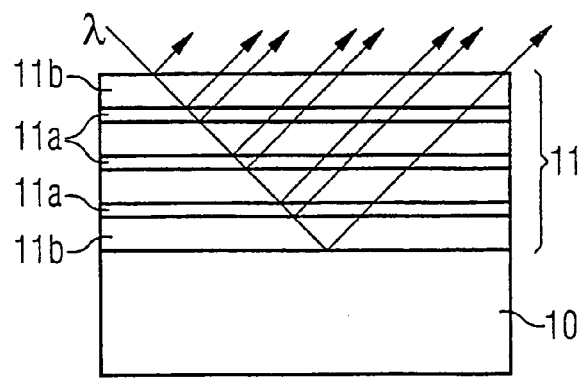

Referring now to the figures of the drawings in detail and first, particularly, to FIG. 1 thereof, there is seen a reflective mirror including a substrate 10 and a multilayer structure 11 having a sequence of thin layers 11a, 11b deposited one on top of the other. A semiconductor substrate or any other sufficiently thick and stable substrate can be used as the substrate 10. Layer thicknesses of the individual layers 11a, 11b are dimensioned in such a way that a wavelength λ is reflected at interfaces of mutually adjacent layers in such a way that reflected partial beams interfere constructively with one another. A highest possible light intensity of an overall reflected radiation is desirable for a short exposure time during exposure of semiconductor products. A large angle of incidence of electromagnetic radiation having the wavelength λ is shown if FIG. 1, merely in order to illustrate the reflection at different interfaces. In practice, the reflection takes place practically perpendicularly to the surface of the multilayer structure 11.

The layer sequence of the multilayer structure 11 in FIG. 1 is produced by progressive deposition of the individual layers, for example through the use of a CVD process (preferably sputtering or ion beam deposition), in which a gas composition is varied with respect to time in such a way that gases supplied to the surface form a desired layer sequence. A two-layer structure including layers of alternate material composition is preferably formed, for instance a sequence of molybdenum and silicon layers alternating with one another. The layer thickness of the individual layers depends on the wavelength used and follows from the condition of constructive interference of the reflected radiation.

Figure 2:
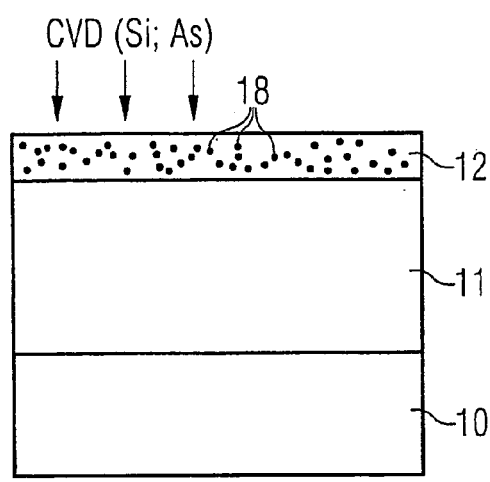

According to FIG. 2, in which the inner structure of the multilayer structure 11 is no longer specifically illustrated, a capping layer 12 is applied to the reflective mirror, preferably through the use of a chemical vapor deposition in which silicon and, at the same time, a dopant for the negative doping 18 of the capping layer, are deposited. Phosphorus or arsenic, for example, may be used as the dopant. All that is critical is that the concentration of the dopant be chosen to be high enough in order to obtain a suitable growth behavior of the oxide grown artificially with the aid of hydrogen peroxide. A high dopant concentration of n-type dopings, in particular, has the effect that, especially during the growth of n-type silicon with the aid of hydrogen peroxide and platinum as catalyst, a very fast growth is achieved, but is slowed down greatly after a few hours. Although this does not necessarily equate to a saturation, the slowing down of the oxide growth obtained (during the accelerated growth process brought about artificially) is suitable for making it more difficult even for a subsequent natural oxide growth to occur. However, even in the case of p-type dopings and with other basic materials for the capping layer, an oxide layer thickness having a homogeneity which cannot be achieved during natural growth is obtained due to the artificially accelerated growth.

Figure 3:
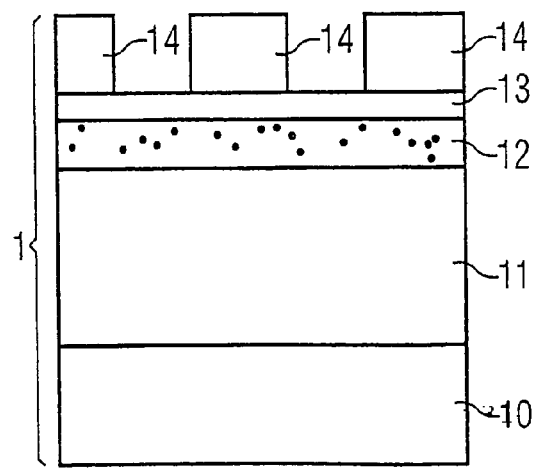

As is seen in FIG. 3, initially a buffer layer 13 is applied to the capping layer 12 and a mask layer 14 is applied to the buffer layer. The mask layer is subsequently patterned, as illustrated. A reflective mirror 1 which is thus provided accordingly acquires a mask structure which prevents reflection of the radiation in regions covered by the mask layer. In the EUV region, in particular, the absorption of the radiation in the mask layer leads to the formation of a positive mask on the reflective mirror or reticle 1.

According to FIGS. 4 and 5, the buffer layer 13 is removed in order to uncover the underlying heavily negatively doped capping layer 12 made of silicon, according to the invention. If the patterning of the mask layer 14 is defective, defects can be corrected with the aid of conventional methods before the buffer layer 13 is removed where it is uncovered.

An oxide layer 15 forms on the uncovered silicon layer 12 which for the first time is exposed to the ambient air for a relatively long time. The oxide layer grows to form a layer thickness of a few nanometers.

The oxide growth which is brought about artificially is illustrated diagrammatically in FIG. 5. The optical mirror, immersed in an aqueous solution of hydrogen peroxide 20 at least with its capping layer 12, is oxidized at room temperature or at elevated temperature, preferably in the presence of platinum or another catalyst. The accelerated oxidation leads to a homogeneous growth which anticipates an inhomogeneous natural growth that otherwise takes place.

The temporal profile of the natural oxide growth of silicon and dioxide is illustrated diagrammatically and purely qualitatively in FIG. 6. It can be seen that the layer thickness of the oxide layer 15 rises monotonically and the time dependence of the oxide layer thickness does not exhibit any particularly striking features. This behavior is observed in the case of conventional capping layers which are made, for instance, of undoped silicon.

The growth provided by a method according to the invention for producing a reflective optical mirror, is illustrated in FIG. 7. Initially, during a time $t_s$, which may lie between half an hour and 2 hours when using hydrogen peroxide with platinum at room temperature, a very much faster growth is obtained than in the case of natural oxidation. If the envisaged minimum layer thickness $d_s$ of between 0.8 and 2.0 nm, for example, is reached, the artificial oxide growth is terminated. Although the optical mirror produced has an oxide layer which reduces the reflectivity of the mirror, this reduction is of the same intensity on all regions of the uncovered capping layer due to the homogeneity of the artificial oxide, so that the mirror has better properties for the lithographic exposure of semiconductor products.

The time-dependent layer thickness profiles of FIGS. 6 and 7 are not shown to scale. In particular, the time axis in FIG. 6 and FIG. 7 is not necessarily linear. However, FIGS. 6 and 7 reveal that the artificially produced oxide is grown significantly faster than a natural oxide of comparable thickness. Primarily, a possible natural growth on the artificially produced oxide layer (the right-hand portion of the layer thickness function to the right of the break point at the time $t_s$ in FIG. 7) takes place at most with the same low growth rate as in the case of natural growth after reaching a corresponding total layer thickness, if not even with a reduced growth rate by comparison therewith.

With the aid of the capping layer doped according to the invention on the reflective mirror, a natural oxide layer is formed which has a homogeneous layer thickness over the entire surface of the capping layer. The layer thickness therefore remains homogeneous and practically constant for a long time. This enables a homogenous reflectivity of the reflective mirror which can be utilized, in particular in semiconductor fabrication, in order to reduce the exposure time for patterning semiconductor products and to increase the throughput.

FIG. 8 diagrammatically shows the construction of a device for the lithographic exposure of a semiconductor product 2 with the aid of a reflective optical mirror or reticle 1. A radiation source 4 for electromagnetic radiation in the extreme UV region between 1 and 100 nm is directed at the reticle 1 by a first non-illustrated imaging optical configuration and generates, at the level of the mask layer 14, an intermediate image which is imaged onto the semiconductor product 2, in particular a wafer 2, after having been demagnified by a factor of 4 to 10 with the aid of a second imaging optical configuration 3, that likewise operates in a reflective manner. With the aid of the exposure operation, a non-illustrated resist layer disposed on the semiconductor substrate is exposed with the demagnified structure of the mask layer 14 and can subsequently be developed in order to pattern a non-illustrated layer on the semiconductor wafer or substrate 2. A stepper 5 moves the semiconductor substrate 2 stepwise in the x and y directions in order to permit different regions on the semiconductor wafer 2 to be repeatedly exposed one after the other. Since a large number of exposure operations are necessary and, moreover, a large number of semiconductor substrates 2 are repeatedly exposed many times in this way, the throughput in the fabrication of semiconductor circuits depends on the required exposure time. By virtue of the capping layer that is heavily negatively doped according to the invention on the reflective optical mirror or reticle 1, a homogeneous oxide layer is formed in accordance with the saturation layer thickness. Since further oxide growth no longer occurs to an appreciable extent, the reflectivity of the mirror remains very high and homogeneous, which enables shorter exposure operations.

We claim:

1. A reflective optical mirror for the lithographic exposure of semiconductor products, the mirror comprising:
    a substrate;
    a multilayer structure disposed above said substrate for reflecting electromagnetic radiation through constructive interference; and
    a capping layer disposed above said multilayer structure, said capping layer formed of a material on which a natural oxide layer forms in air, said material of said capping layer being doped and said oxide layer including a region having a layer thickness with the same doping as said capping layer, said same doping being incorporated into an oxide of said oxide layer.

2. The reflective mirror according to claim 1, wherein said layer thickness of maid oxide layer is between 0.8 and 2.0 nm.

3. The reflective mirror according to claim 1, wherein said capping layer is formed of n-doped silicon.

4. The reflective mirror according to claim 1, wherein said capping layer is doped with a material selected from the group consisting of phosphorus and arsenic.

5. The reflective mirror according to claim 1, wherein said capping layer is amorphous.

6. The reflective mirror according to claim 1, which further comprises a patterned mask layer for patterning a semiconductor product.

7. The reflective mirror according to claim 6, wherein said patterned mask layer is disposed above said capping layer.

8. The reflective mirror according to claim 1, wherein said multilayer structure is dimensioned to cause electromagnetic radiation having a wavelength greater than 1 nm and less than 100 nm to be reflected.

* * * * *